United States Patent
Kurosawa et al.

(10) Patent No.: US 8,519,699 B2
(45) Date of Patent: Aug. 27, 2013

(54) ELECTRICAL COIL AND MANUFACTURING PROCESS THEREFOR

(75) Inventors: Mikio Kurosawa, Sagamihara (JP); Takashi Kato, Kawasaki (JP)

(73) Assignee: LEM Intellectual Property SA, Fribourg (CH)

( * ) Notice: Subject to any disclaimer, the term of this patent is extended or adjusted under 35 U.S.C. 154(b) by 507 days.

(21) Appl. No.: 12/661,161

(22) Filed: Mar. 11, 2010

(65) Prior Publication Data
US 2010/0231200 A1    Sep. 16, 2010

(30) Foreign Application Priority Data
Mar. 12, 2009 (EP) .................................. 09155058

(51) Int. Cl.
*G01R 1/20* (2006.01)
*H01F 27/30* (2006.01)

(52) U.S. Cl.
USPC ............................ 324/126; 336/207; 336/205

(58) Field of Classification Search
None
See application file for complete search history.

(56) References Cited

U.S. PATENT DOCUMENTS

| 3,157,048 | A   | * | 11/1964 | Williams ...................... 73/304 R |
| 4,706,017 | A   | * | 11/1987 | Wilson .......................... 324/127 |
| 6,005,383 | A   | * | 12/1999 | Savary et al. .............. 324/117 H |
| 6,121,867 | A   |   | 9/2000  | Uda et al. |
| 6,624,624 | B1  | * | 9/2003  | Karrer et al. .............. 324/117 R |
| 7,622,909 | B2  | * | 11/2009 | Teppan ......................... 324/126 |
| 7,969,140 | B2  | * | 6/2011  | Teppan ......................... 324/127 |
| 2003/0128092 | A1 |  | 7/2003  | Maguire et al. |
| 2008/0094162 | A1 | * | 4/2008  | Schaerrer et al. ............. 336/178 |
| 2009/0295384 | A1 | * | 12/2009 | Teppan ......................... 324/253 |
| 2010/0301852 | A1 | * | 12/2010 | Teppan et al. ................. 324/253 |

FOREIGN PATENT DOCUMENTS
DE    196 27 819 A1    1/1998
GB         668752       3/1952

* cited by examiner

*Primary Examiner* — Jermele M Hollington
(74) *Attorney, Agent, or Firm* — Faegre Baker Daniels LLP

(57) ABSTRACT

An electrical current sensor is disclosed having conducting coil portion and an insulating body portion, the conducting coil portion comprising a coil portion with one or more helical windings made of a wire conductor and encircling a central cavity. Adjacent windings are separated by a dielectrically effective gap, wherein the insulating body portion comprises a dielectric spacer comprising a helical gap maintaining protuberance configured for insertion in the central cavity of the windings such that the gap maintaining protuberance is at least partially inserted in the gap between windings.

17 Claims, 4 Drawing Sheets

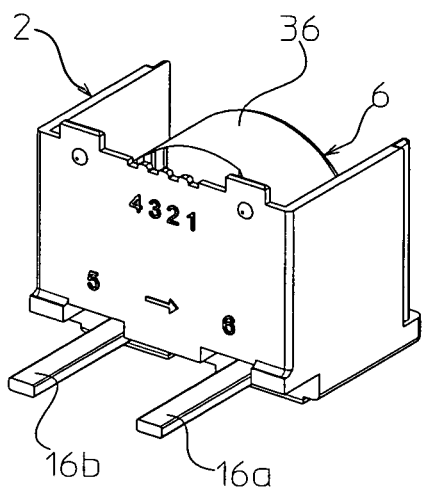
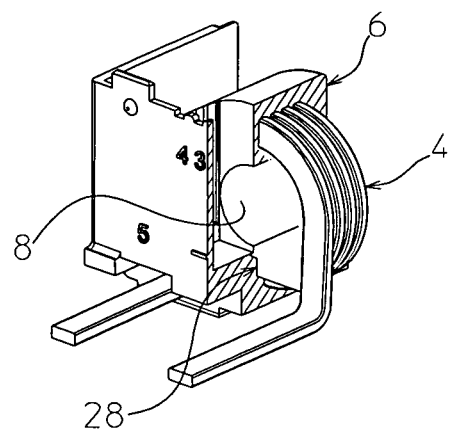
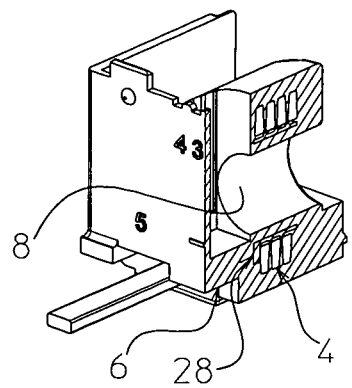

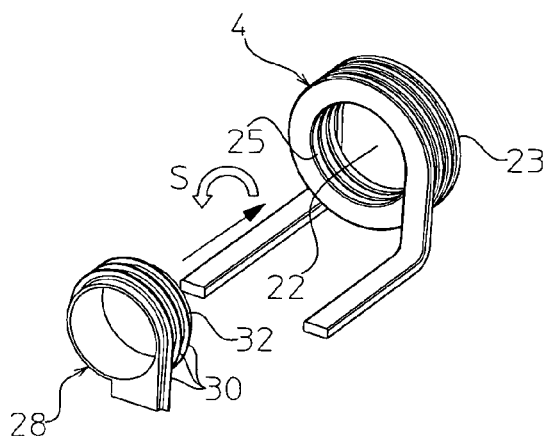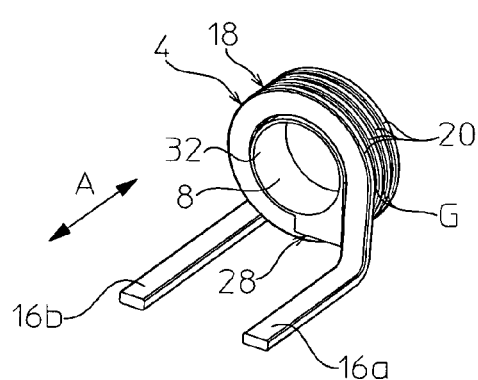
Figure 3a
Figure 3b
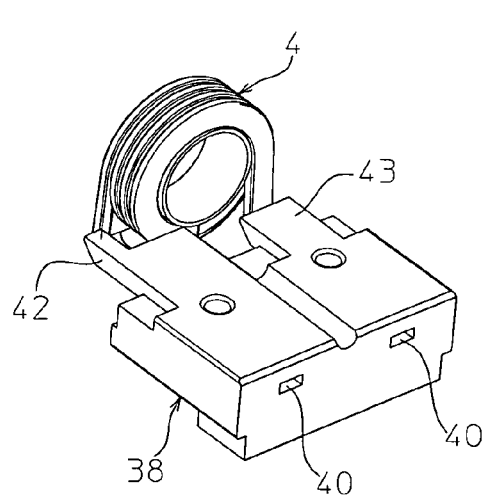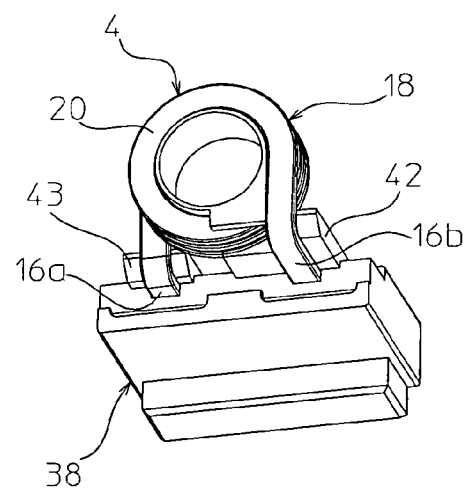
Figure 4a
Figure 4b

ELECTRICAL COIL AND MANUFACTURING PROCESS THEREFOR

BACKGROUND

The present invention relates to an electrical current sensor comprising a coil made of a wound electrical conductor, and a method of manufacturing the current sensor. The invention relates in particular to a current sensor with a coil formed of self-supporting windings made of an electrical conductor with a cross-sectional area greater than 0.3 mm$^2$.

In electrical current sensing applications, it is well-known to provide a current sensor comprising a coil with one or more turns through which a primary current to be measured flows, the magnetic field generated by the primary current flowing through the coil being detected and used as a measure of the primary current.

The number of windings of a coil affects the amplitude of the magnetic field generated or picked up by the coil and it is thus important to ensure good electrical insulation between windings of a coil. In current sensing applications the dimensional accuracy of the coil may also be important to ensure accurate and efficient measurement of the parameter to be measured.

One common technique for ensuring insulation between windings of a coil is to coat the wire conductor forming the coil with a dielectric outer coating layer. Extremities of the conductor forming the coil need to be electrically interconnected to an electrical circuit which thus requires removal of insulation from the connection ends of the conductor. This is difficult and costly to implement in an automated manufacturing process, particularly for connection ends that require a relatively large connection surface or that are configured for surface mount solder connection to circuit boards.

For current sensor coils made of only a few windings for example from one to ten windings, made of a relatively thick self-supporting conductor, it is known to form the windings of the coil from a non-coated conducting bar or wire such that the winding forms a helical shape where the windings of the coil are separated by an air gap. The helical coil portion is then overmolded with an insulating material, such that insulating material fills the air gap between the windings. Alternatively, in certain applications the helical coil winding is simply lodged in a housing whereby the electrical insulation between windings of the coil is provided simply by the air gap which is intended to be maintained by the rigidity of the conductor wire or bar forming the coil. Once the helical windings of the coil have been formed, the air gap between the windings, or more generally the geometry of the windings, may be altered during transport or storage of the coils or during the overmolding or assembly process such that the distance separating adjacent windings is insufficient to ensure adequate electrical insulation for the desired accuracy and performance of the coil during its intended use. The care required for handling of the coil windings once formed also increases manufacturing costs.

SUMMARY

It is an object of this invention to provide a current sensor comprising a coil formed of self-supporting windings made of an electrical conductor with a cross-sectional area greater than 0.3 mm$^2$ that is economical to manufacture and that ensures the desired minimum insulation between windings of the coil. It is a further object of this invention to provide an economical and reliable manufacturing process for the aforementioned current sensor.

It would be advantageous to provide a current sensor comprising a coil and a manufacturing process therefor enabling handling of the components forming the current sensor during the manufacturing process that reduces the risk of distortion of the coils.

It would advantageous to provide a current sensor that is robust and dimensionally accurate.

It would be advantageous to provide a current sensor comprising a coil and a manufacturing process therefor that enables easy and versatile connection of the current sensor to an electrical or electronic circuit in which the sensor is intended to be implemented.

Objects of this invention have been achieved by providing a current sensor comprising a conducting coil portion and an insulating body portion. The conducting coil portion comprises a coil portion with one or more windings made of a wire conductor and surrounding a central cavity, adjacent windings being separated by a dielectrically effective gap. The insulating body portion comprises a dielectric spacer comprising a gap maintaining protuberance in the form of a continuous or non-continuous helical thread configured for screw insertion in the central cavity of the windings or around the windings such that the gap maintaining protuberance is at least partially inserted in the gap between windings.

An inventive process for manufacturing a current sensor comprises the steps of forming a conducting coil portion from a conducting wire having a cross-section area greater than 0.3 mm$^2$ with one or more windings, and rotatably inserting a dielectric spacer comprising a gap maintaining protuberance in the form of a continuous or non-continuous helical thread into a central cavity of the helical windings such that the helical gap maintaining protuberance of the spacer is threadably inserted into a gap between the windings.

A further inventive process for manufacturing a current sensor comprises the steps of forming a conducting coil portion from a conducting wire having a cross-section area greater than 0.3 mm$^2$ with one or more windings, and inserting a dielectric spacer comprising a gap maintaining protuberance in the form of a continuous or non-continuous helical thread around the windings such that the helical gap maintaining protuberance of the spacer is inserted into a gap (G) between the windings, said dielectric spacers being affixed to the coil by mounting around the coil portion from an outer peripheral side of the coil.

Disclosed herein is an electrical current sensor comprising a conducting coil portion and an insulating body portion, the conducting coil portion comprising a coil portion with one or more windings made of a wire conductor and surrounding a central cavity, adjacent windings being separated by a dielectrically effective gap, wherein the insulating body portion comprises a dielectric spacer comprising a gap maintaining protuberance configured for insertion in the central cavity of the windings or around the windings such that the gap maintaining protuberance is at least partially inserted in the gap between windings.

The conducting coil portion comprises a wire conductor having a cross-section greater than 0.3 mm$^2$, the coil conducting portion having less than 10 windings. In an embodiment, the insulating body portion comprises a dielectric spacer comprising an outer helical thread configured for insertion in the central cavity formed by the helical windings of the conducting coil portion such that the helical thread is at least partially inserted in the gap between windings.

This configuration ensures that an accurate dielectrically effective spacing is maintained between adjacent windings or turns of the coil conducting portion. A bare (i.e. non-dielectrically coated) conducting wire may be used to form the coil conducting portion thus eliminating the need to uncoat the terminal ends of the coil which may be directly connected to an electronic or electrical circuit to which the current sensor is intended to be connected.

The conducting coil portion may advantageously be formed of an essentially rectangular cross-section shaped conducting wire. The terminal connection ends of the conducting coil portion may be bent into a plane essentially parallel to a central axis of the helical winding extending through the central cavity of the winding.

The insulating body portion preferably further comprises a dielectric overmolding encapsulating at least an external peripheral region of the conducting coil portion and projecting at least partially into the gap between adjacent windings of the coil portion. The overmolding may advantageously be in a form of an injected polymer encapsulating the conducting coil portion and filling the gap between the coil up to and around the inserted spacer, the spacer and encapsulation thus providing an integral body portion completely surrounding the windings of the conductor portion thus ensuring accurate and robust dielectric separation of the windings. The spacer and overmolding may advantageously be made of the same injectable plastics material, but it is also possible to provide the spacer and overmolding from two different materials.

In an alternative embodiment, the insulating body portion may comprise in lieu of the overmolding, a housing made of one or more elements that is assembled around the coil conducting portion. The housing may optionally comprise protuberances configured to be inserted in the helical winding gaps between adjacent windings around an outer periphery of the windings thus supporting the coil windings at their outer periphery, optionally also in the inner periphery by means of the spacer helical thread.

A method of making a coil for sensing applications according to this invention comprises the steps of forming a conducting coil portion from a conducting wire having a cross-section area greater than 0.3 mm² with one or more windings, and inserting a dielectric spacer comprising a gap maintaining protuberance into a central cavity of the windings or around the windings such that the gap maintaining protuberance of the spacer is inserted into a gap (G) between the windings.

In an embodiment, the spacer may be inserted in the cavity of the coils by rotating the spacer therein such that the helical thread of the spacer threads into the gap between the helical windings of the coil conducting portion.

The manufacturing process may further comprise overmolding a dielectric material around the windings thereby encapsulating them in an overmolded body portion.

BRIEF DESCRIPTION OF THE DRAWINGS

Further objects and advantageous features of the invention will be apparent from the claims and the following detailed description of embodiments of the invention and the annexed drawings in which:

FIG. 1a illustrates a perspective view of a current sensor according to an embodiment of this invention;

FIG. 1b is a partial cross-section of the view of FIG. 1a;

FIG. 1c is a cross-section of the view of FIG. 1a;

FIG. 2b is a cross-sectional view through line 2b-2b of FIG. 2a;

FIG. 3a is a view in perspective of a coil conducting portion and spacer of a current sensor according to an embodiment of this invention prior to assembly;

FIG. 3b is a view in perspective of the components of FIG. 3a assembled;

FIG. 4a is a perspective view of the assembly according to FIG. 3b mounted in a portion of an injection moulding die prior to overmolding;

FIG. 4b is another perspective view of the assembly of FIG. 4a;

DETAILED DESCRIPTION OF THE EMBODIMENTS

Figure 2A:
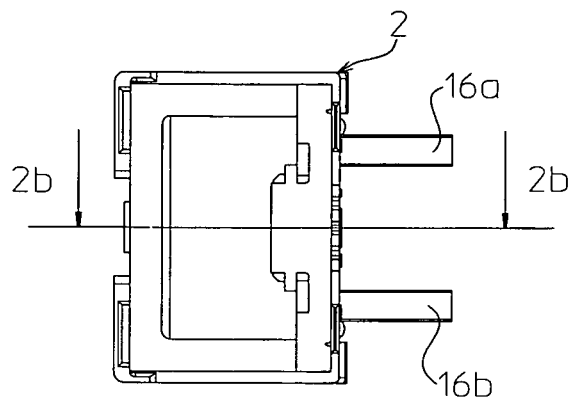
FIG. 2a is a plan view of a current sensor according to an embodiment of this invention.

Referring to the figures, a current sensor 2 comprises a conducting coil portion 4 and an insulating body portion 6. The coil has a central portion forming a central passage 8 traversing the conducting coil portion and insulating body portion intended to receive therethrough a magnetic circuit to conduct the magnetic flux generated by the coil. Alternatively, a portion of magnetic circuit may be pre-assembled to the current sensor 2, by insertion through the central passage and overmolded by the insulating body portion 6. In an alternative embodiment (not shown), the central portion may be filled with the dielectric material of the insulating body portion or other material or element whereby the magnetic field generated by the conducting coil portion is picked-up by a magnetic field sensor arranged on or outside the insulating body portion externally of the central portion. In yet another embodiment (not shown), a magnetic field sensor could be positioned within or embedded within the insulating body portion inside the central portion.

The conducting coil portion 4 in the embodiment shown, is made of a metal conducting wire 10 with a rectangular cross-section having a height H and width W and a surface area H×W that is preferably greater than 0.3 mm² so that once formed the conducting coil portion is stable and self-supporting and moreover can be used in applications for sensing currents in excess of 0.1 amperes, preferably in the range of 1 to 50 amperes, and normally not exceeding 200 amperes. The cross-sectional profile of the conducting wire 10 is preferably approximately rectangular with the long faces 12 of height H of the coil windings oriented essentially in the radial direction R and the short faces 14 of width W of the coil winding oriented essentially in the axial direction A of the conducting coil portion.

The conducting coil portion comprises connection ends 16a, 16b and a helical coil portion 18 made of one or more windings 20 separated from each other by a gap G as defined in the axial direction A. The helical windings 18 have an outer radial periphery 23, and an inner radial periphery 25 defining a central cavity 22 extending axially therethrough. A magnetic circuit branch (not shown) or magnetic field detector (not shown) may be mounted in the cavity 22 (depending on the embodiment) or the cavity may simply remain open or be filled with a dielectric material. The windings generate a magnetic field within the central cavity 22 when an electrical current flows in the wire conductor 10. The number of windings 20 (also called turns) of the coil portion 18 defines the strength of the magnetic field to be generated in the central cavity 22 as a function of the amplitude of the electrical current flowing in the wire conductor. For greater measurement sensitivity or smaller current amplitudes, a large number of windings are required, whereas for large amplitude currents or low measurement sensitivity only one or a few turns are required. For the intended current sensing applications according to this invention, the number of turns of the conducting coil portion lays in a range of one to ten, preferably in the range of two to six turns.

In order to form a conducting coil portion with sufficient stability, compactness and easy formability, the approximately or essentially rectangular cross-section of the conducting wire preferably has a width W to height H ratio (W/H) that is in the range of 0.1 to 3, more preferably in the range of 0.2 to 0.8. The length of the gap G between adjacent windings is preferably less than 1.0 times the width W of the conductor, more preferably less than 0.6 times the width W of the conductor and may be for example around 0.2 times the width W of the conductor. The radius Ro of the outer periphery 23 of the helical coil portion 18 is inferior to 20 mm for the intended sensing applications whereby the ratio of the height H of the conductor wire and the winding outer radius Ro (H/Ro) is preferably in the range of 0.1 to 0.5 preferably in a range of 0.2 to 0.4 to provide a coil with good mechanical stability and dimensional accuracy for the intended current sensing application and ranges.

The connection ends 16a, 16b of the conducting coil portion may be advantageously configured as flat tabs for pluggable connection to complementary female terminals, or for surface amount solder connection or welding to a circuit board or substrate of an electrical or electronic circuit to which the current sensor is intended to be connected. If the conducting wire has a rectangular shape as described above in relation to a preferred embodiment, it is possible to provide the connection ends 16a, 16b as simple extensions of the conducting wire without any particular additional forming operations, while nevertheless enabling optimal connection to an external circuit.

The insulating body portion 6 comprises a spacer 28 comprising a gap maintaining protuberance 30 extending from a support portion 32 radially outwards and distributed along a helical manner around the support in a manner complementary to the helical gap G formed between the helical windings of the coil such that the protuberances 30 project radially into the gap between adjacent windings to maintain a dielectrically effective gap distance between the windings 20. The support 32 preferably has a cylindrical or essentially cylindrical outer surface along at least peripheral portions thereof so as to bear against the inner radial periphery 25 of the windings 20. In the embodiment illustrated in FIGS. 3a, 3b the spacer 28 may be assembled to the helical coil portion 18 by screwing (S) the spacer (i.e. rotating the spacer) into the helical coil portion.

It may be noted that it is possible to provide the gap maintaining protuberance as a continuous helical thread 30 similar to a helical screw thread, or as discrete protuberances distributed in a helical manner around the support (i.e. a non-continuous screw thread). In an alternative embodiment, the spacer could be assembled to the coil by using the spacer as part of a die around which the wire conductor is wound to form the helical coil portion such that the spacer is directly assembled to the coil when the coil is being formed.

Referring to FIGS. 5a to 5d, in another embodiment the insulating body portion comprises a spacer 28' comprising a gap maintaining protuberance 30' extending from a support portion 32' radially inwards in a manner complementary to the helical gap G formed between the helical windings of the coil such that the protuberances 30' project into the gap between adjacent windings to maintain a dielectrically effective gap distance between the windings 20. The support 32' preferably has a partial cylindrical inner surface so as to bear against a portion of the outer radial periphery 23 of the windings 20. In a variant of this embodiment, it is possible to have more that one spacer, for example two spacers, that are mounted around the coil portion from opposite sides. The two or more spacers may be fixed together after mounting around the windings, for example by mechanical means such as interengaging clips, or bonded together for example by welding.

Figure 5A:
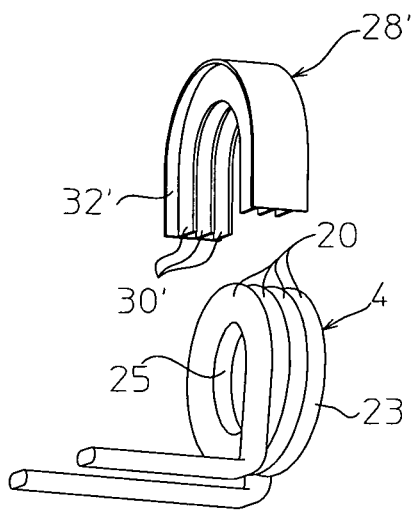
FIG. 5a is a view in perspective of a coil conducting portion and spacer of a current sensor according to another embodiment of this invention prior to assembly.
Figure 5B:
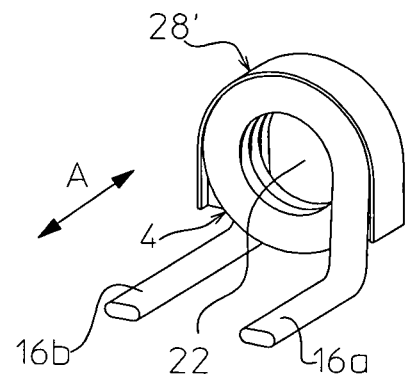
FIG. 5b is a view in perspective of the components of FIG. 5a assembled.
Figure 5C:
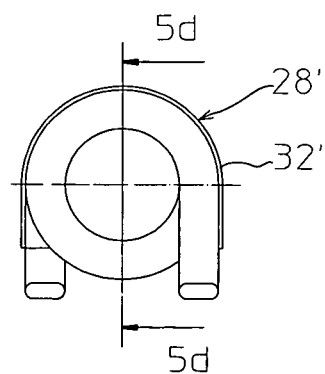
FIG. 5c is a plan view of the components of FIG. 5b assembled.
Figure 5D:
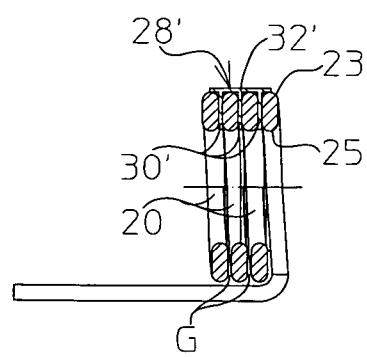
FIG. 5d is a cross-sectional view through line A-A of FIG. 5c.

The current sensor according to this invention could be formed of the spacer 28, 28' and conducting coil portion 4 (as illustrated in FIG. 3b or 5b) alone, or mounted inside a dielectric housing with the connection ends 16a, 16b extending out of the housing for external connection of the current sensor.

Figure 2B:
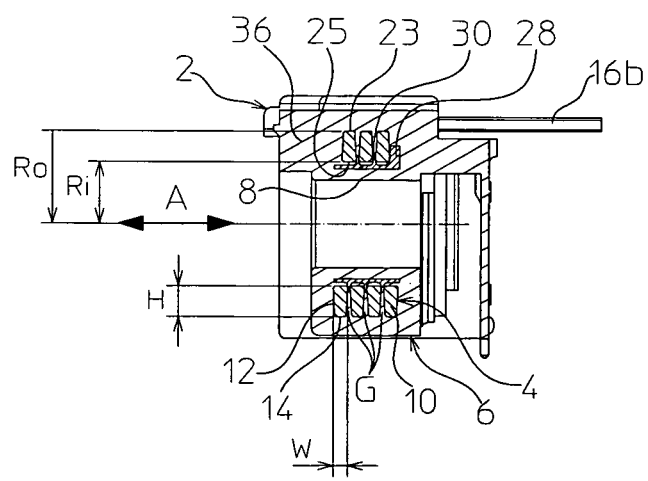

In a preferred embodiment, as illustrated in FIGS. 1 and 2, the insulating body portion 6 further comprises an overmolding 36 encapsulating the conducting coil portion and spacer 28. The overmolding covers the conducting coil portion entirely except for the connection ends 16a, 16b and extends into the gap G between the windings 20 of the coil from the outer periphery and fills the space up to the gap maintaining protuberance 30, 30' of the spacer. The spacer and overmolding thus ensure dimensional accuracy and good dielectric properties of the coil in a robust and stable manner. As illustrated in FIGS. 4a, 4b, a part of a molding die 38 is shown holding the connection ends of the coil in complementary cavities 40 of the die. Distance setting extensions 42, 43 of the die 38 ensure that the correct spacing between the outermost windings an axial ends of the coil portion 18 are maintained.

In the preferred embodiment, the coil portion has an essentially cylindrical form with helical windings, however it is possible within the scope of this invention to provide a winding that is essentially square shaped (viewed in the direction of the axis A of the central cavity 22), polygonally shaped, rectangular shaped or elliptically shaped. In the latter variants it would still be possible to thread in a spacer 28 however the gap maintaining protuberance would only insert between the windings along certain portions. In the case of a spacer 28' mounted around the windings, the spacer could be made to conform essentially to the shape of the outer periphery of the coil portion.

The invention claimed is:

1. Electrical current sensor comprising a conducting coil portion and an insulating body portion, the conducting coil portion comprising a coil portion with one or more windings made of a wire conductor and surrounding a central cavity, adjacent windings being separated by a dielectrically effective gap, wherein the insulating body portion comprises a dielectric spacer comprising a gap maintaining protuberance in the form of a continuous or non-continuous helical thread configured for screw insertion in the central cavity of the windings or around the windings such that the gap maintaining protuberance is at least partially inserted in the gap between windings.

2. Electrical current sensor according to claim 1 wherein the wire conductor is a bare conductor wire.

3. Electrical current sensor according to claim 1 wherein the wire conductor has a cross-section area greater than 0.3 mm2 and the coil conducting portion has less than 10 windings.

4. Electrical current sensor according to claim 1 wherein the wire conductor has an essentially rectangular cross-section of height H and width W.

5. Electrical current sensor according to claim 4 wherein the ratio of the width to the height (W/H) of the wire conductor is in the range of 0.4 to 0.8.

6. Electrical current sensor according to claim 1 wherein the dielectrically effective gap (G) between the turns is smaller than 1 mm.

7. Electrical current sensor according to claim 1 wherein the insulating body portion further comprises a dielectric overmolding encapsulating at least partially the windings of the conducting coil portion.

8. Electrical current sensor according to claim 7 wherein the dielectric overmolding projects at least partially into the gap between adjacent windings (20) of the coil portion.

9. Electrical current sensor according to claim 7 or 8 wherein the overmolding is an injected polymer encapsulating the conducting coil portion and filling the gap between the coil windings up to and around the inserted spacer, the spacer and encapsulation providing an integral body portion completely surrounding the windings of the conductor portion, connection ends of the conducting coil portion protruding from the overmolding.

10. Electrical current sensor comprising a conducting coil portion and an insulating body portion, the conducting coil portion comprising a coil portion with one or more windings made of a wire conductor and surrounding a central cavity, adjacent windings being separated by a dielectrically effective gap (G), wherein the insulating body portion comprises a dielectric spacer comprising a gap maintaining protuberance in the form of a continuous or non-continuous helical thread configured for screw insertion in the central cavity of the windings or around the windings such that the gap maintaining protuberance is at least partially inserted in the gap (G) between windings, and wherein the insulating body portion further comprises a dielectric overmolding encapsulating at least partially the windings of the conducting coil portion.

11. Electrical current sensor according to claim 10 wherein the wire conductor is a bare conductor wire.

12. Electrical current sensor according to claim 10 wherein the wire conductor has a cross-section area greater than 0.3 mm2 and the coil conducting portion has less than 10 windings.

13. Electrical current sensor according to claim 10 wherein the wire conductor has an essentially rectangular cross-section of height H and width W.

14. Electrical current sensor according to claim 10 wherein the ratio of the width to the height (W/H) of the wire conductor is in the range of 0.4 to 0.8.

15. Electrical current sensor according to claim 11 wherein the dielectrically effective gap (G) between the turns is smaller than 1 mm.

16. Electrical current sensor according to claim 10 wherein the dielectric overmolding projects at least partially into the gap (G) between adjacent windings of the coil portion.

17. Electrical current sensor according to claim 10 wherein the overmolding is an injected polymer encapsulating the conducting coil portion and filling the gap (G) between the coil windings up to and around the inserted spacer, the spacer and encapsulation providing an integral body portion completely surrounding the windings of the conductor portion, connection ends of the conducting coil portion protruding from the overmolding.

* * * * *